(12) United States Patent
Murakami et al.

(10) Patent No.: US 7,546,091 B2
(45) Date of Patent: Jun. 9, 2009

(54) HIGH-FREQUENCY CIRCUIT AND HIGH-FREQUENCY DEVICE

(75) Inventors: Yoshiyuki Murakami, Tottori-ken (JP); Hiroyuki Tai, Tottori-ken (JP); Shigeru Kemmochi, Saitama-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 256 days.

(21) Appl. No.: 10/598,879

(22) PCT Filed: Mar. 16, 2005

(86) PCT No.: PCT/JP2005/004690

§ 371 (c)(1),
(2), (4) Date: Sep. 14, 2006

(87) PCT Pub. No.: WO2005/088833

PCT Pub. Date: Sep. 22, 2005

(65) Prior Publication Data

US 2007/0190954 A1 Aug. 16, 2007

(30) Foreign Application Priority Data

Mar. 16, 2004 (JP) ............................. 2004-073871

(51) Int. Cl.
*H04B 1/44* (2006.01)
(52) U.S. Cl. .................... 455/78; 455/83; 333/100
(58) Field of Classification Search .......... 455/550.1, 455/552.1, 78, 82, 83, 84, 132, 188.1, 191.3; 333/100, 101; 370/276, 277, 278, 297
See application file for complete search history.

(56) References Cited

U.S. PATENT DOCUMENTS

| | | | |
|---|---|---|---|
| 6,025,761 A | 2/2000 | Watanabe et al. | |
| 6,437,676 B1 | 8/2002 | Takeda et al. | |
| 7,023,385 B2* | 4/2006 | Harihara | 343/700 MS |
| 7,376,440 B2* | 5/2008 | Forrester et al. | 455/553.1 |
| 2002/0090974 A1* | 7/2002 | Hagn | 455/552 |
| 2002/0137471 A1* | 9/2002 | Satoh et al. | 455/83 |

(Continued)

FOREIGN PATENT DOCUMENTS

CN 1507105 A 6/2004

(Continued)

OTHER PUBLICATIONS

:Microwave Flash News Briefs; Internet Citation: Dec. 16, 2003; XP007907288.

(Continued)

*Primary Examiner*—Nguyen Vo
(74) *Attorney, Agent, or Firm*—Sughrue Mion, PLLC

(57) ABSTRACT

A high-frequency circuit for branching high-frequency signals for pluralities of communications systems of different frequencies, which comprises a lowpass filter circuit disposed between first and second ports and/or a highpass filter circuit disposed between the first port and a fourth port; and a matching circuit and a bandpass filter circuit disposed between the first port and a third port; the lowpass filter circuit, the highpass filter circuit and the matching circuit comprising capacitance elements and inductance elements; the bandpass filter circuit being a SAW filter; and the passband f1 of the lowpass filter circuit, the passband f2 of the bandpass filter circuit, and the passband f3 of the highpass filter circuit meeting the condition of f1<f2<f3.

12 Claims, 9 Drawing Sheets

U.S. PATENT DOCUMENTS

| | | | |
|---|---|---|---|
| 2003/0092397 A1* | 5/2003 | Uriu et al. | 455/82 |
| 2003/0189910 A1* | 10/2003 | Yamada et al. | 370/335 |
| 2004/0116098 A1 | 6/2004 | Ochii et al. | |
| 2004/0132487 A1* | 7/2004 | Kearns | 455/552.1 |
| 2004/0266378 A1 | 12/2004 | Fukamachi et al. | |
| 2007/0207748 A1* | 9/2007 | Toncich | 455/107 |

FOREIGN PATENT DOCUMENTS

| | | |
|---|---|---|
| EP | 1 152 543 A1 | 11/2001 |
| JP | 09-153842 A | 6/1997 |
| JP | 9-153842 A | 6/1997 |
| JP | 11-127052 A | 5/1999 |
| JP | 2001-15354 A | 1/2001 |
| JP | 2003-008385 | 1/2003 |
| JP | 2003-87096 A | 3/2003 |
| JP | 2003-115736 A | 4/2003 |
| JP | 2003-152590 A | 5/2003 |
| JP | 2003-209454 A | 7/2003 |
| JP | 2003-273687 A | 9/2003 |
| JP | 2004-194240 A | 7/2004 |
| WO | WO 03/005056 A2 | 1/2003 |

OTHER PUBLICATIONS

Lucero R et al: "Design of an LtCC switch diplexer front-end module for GSM/DCS/PCS applications"; 2001 IEEE RFIC Symposium May 20, 2001; pp. 213-216.

Lucero R et al; "Designs of an LTCC Integrated Tri-Band Direct Conversion Receiver Front-end Module";2002 IEEE MTTS-S International Microwave Symposium, Jun. 2, 2002; pp. 1545-1548.

* cited by examiner (a)                    (b)

HIGH-FREQUENCY CIRCUIT AND HIGH-FREQUENCY DEVICE

FIELD OF THE INVENTION

The present invention relates to a high-frequency circuit for branching high-frequency signals for pluralities of communications systems, which is usable for mobile communications equipments such as mobile phones, short-distance, wireless communications equipments such as W-LAN and Bluetooth (R), etc., and a high-frequency device comprising such a high-frequency circuit.

BACKGROUND OF THE INVENTION

There are various standards and systems in wireless communications at present, and pluralities of frequency bands (multi-band) in pluralities of systems (multi-mode) are required for mobile communications equipments such as mobile phones, etc., for the convenience of increased numbers of users. There are various access systems in mobile phones available worldwide at present, and pluralities of access systems are used in some areas. Since a first-generation, analog, mobile phone system utilizing FDMA (frequency division multiple access), there have been PDC (personal digital cellular) as a second-generation digital mobile phone system using TDMA (time division multiple access), GSM (global system for mobile communications) and DCS (digital cellular system) mainly used in Europe, and DAMPS (digital advanced mobile phone service) and PCS (personal communications service) mainly used in the U.S. as presently main multiple systems. GSM, DAMPS, DCS and PCS are sometimes called GSM850, GSM900, GSM1800 and GSM1900, respectively. In the GSM system, data-transmitting technologies such as GPRS (general packet radio service) and EDGE (enhanced data GSM environment) are used with its mobile phone network.

A CDMA (code division multiple access) system has recently been spreading in the U.S., Europe, China, Korea and Japan. Because the CDMA system is better than the TDMA system in capacity for accepting many users, the CDMA system is a technology attracting the most attention at present. Because technologies for achieving high control of transmitting power were established, they have been being applied to mobile communications systems with drastically changeable length and loss of wireless transmission paths.

The CDMA system according to the IMT-2000 standard determined by the International Transmission Union (ITU) is used for a so-called third-generation mobile communications system providing various services, etc. utilizing high-speed data transmission and multi-media.

As the CDMA system, there are CDMA 2000, a higher standard of cdmaOne, standardized by IS-95 (interim standard-95), which is the U.S. standard; DS-CDMA (direct spread code division multiple access), which is also called W-CDMA, and TD-CDMA (time division code division multiple access) as the universal mobile telecommunications systems (UMTS) of the European standard; and TD-SCDMA (time division synchronous code division multiple access), which is a Chinese standard. TD-CDMA and TD-SCDMA are different from other CDMA systems in that they use a time division duplex (TDD) technology of switching the uplink and downlink transmissions in a short period of time for communications.

Because a law imposing telecommunications carriers to identify transmitting positions at the time of emergency call by mobile phones has been enforced in the U.S., the navigation function of a global positioning system (GPS) has recently been added to mobile communications apparatuses such as mobile phones, etc. In Japan, etc. too, mobile phones with GPS navigation functions have been increasing for the convenience of users.

In data-transmitting technologies, there is WLAN, which has pluralities of standards, such as Bluetooth (R) using an FHSS (frequency hopping spread spectrum) system in a 2.4-GHz ISM (industrial, scientific and medical) band; IEEE802.11a using an OFDM (orthogonal frequency division multiples) modulation system in a 5-GHz band; IEEE802.11b using a DSSS (direct sequence spread spectrum) system in a 2.4-GHz ISM (industrial, scientific and medical) band like Bluetooth(R); IEEE802.11g using an OFDM (orthogonal frequency division multiples) modulation system in a 2.4-GHz band, etc. Mobile phones using these data transmission technologies are also increasing.

It is required that high-frequency devices in front-end parts (high-frequency circuit parts) of such mobile communications apparatuses can be used in pluralities of systems in pluralities of frequency bands, with reduced size.

JP2000-156651A discloses a communications terminal capable of being used in both a TDMA system having different transmitting/receiving timing and a DS-CDMA system conducting transmitting and receiving simultaneously. FIG. 15 is a block diagram showing its high-frequency circuit part. This communications terminal comprises a high-frequency SP3T (single-pole, triple-throw) switch 100 connected to one common antenna, a diplexer 200 handling the input/output signals of the CDMA system, transmitting and receiving parts of TDMA, and transmitting and receiving parts of CDMA, the high-frequency switch 100 switching a signal path to the diplexer 200 handling the input/output signals of the CDMA system and to the transmitting and receiving parts of TDMA.

In the high-frequency circuit of JP2000-156651A, the transmitting/receiving signals of CDMA are branched by the diplexer 200. For instance, in the case of W-CDMA, whose transmitting signal and receiving signal have close frequencies, the diplexer 200 should have steep attenuation characteristics. However, because such diplexers are large in size, their use inevitably makes dual-band, mobile phones (multi-band communications apparatuses) large in size. Also, because the TDMA wireless parts and the CDMA wireless parts are switched by the high-frequency switch 100, it is impossible to simultaneously handle the input/output signals of the CDMA and TDMA systems, for instance, to make communications by the TDMA system while receiving the signal of the CDMA system. Of course, communications by the TDMA or CDMA system while receiving a GPS signal are also impossible.

JP2003-8385A discloses composite LC filter circuits (diplexers) for branching signals having three different frequencies. FIG. 16 is a block diagram showing their circuits. These composite LC filter circuits are constituted by a lowpass filter LPF1, one or two bandpass filters BPF, and a highpass filter HPF 1. The lowpass filter LPF 1 connected between the first port P1 and the second port P2 has a passband f1. The highpass filter HPF1 connected between the first port P1 and the second port P4 has a passband f3 (>f1). The bandpass filter BPF connected in series between the first port P1 and the third port P3 has a passband f2 (f1<f2<f3). Exemplified usable systems are AMPS, PCS, GSM, DCS, W-CDMA and GPS. Frequency bands used in the above communications systems are shown in Table 1 below.

TABLE 1

| Communications System | Transmitting Frequency Band TX (MHz) | Receiving Frequency Band RX (MHz) |
|---|---|---|
| GSM | 880-915 | 925-960 |
| DAMPS | 824-849 | 869-894 |
| PDC | 940-956 | 810-826 |
| DCS | 1710-1785 | 1805-1880 |
| PCS | 1850-1910 | 1930-1990 |
| WCDMA | 1920-1980 | 2110-2170 |
| GPS | — | 1574.42-1576.42 |
| WLAN | 2.4-GHz band, 5-GHz band | |

In the composite LC filter circuits described in JP2003-8385A, each filter is contained in a laminate substrate as an LC filter to achieve size reduction. However, the bandpass filter BPF constituted by an LC filter needs a parallel resonance circuit comprising an inductance element and a capacitance element, another parallel resonance circuit comprising an inductance element and a capacitance element, and pluralities of coupled capacitance elements, inevitably resulting in larger numbers of elements than in the highpass filter and the lowpass filter. Also, when off-band attenuation is not sufficiently achieved, the number of elements for forming resonance circuits, for instance, may have to be increased.

In addition, when the reactance elements are formed by electrode patterns in the laminate substrate, attention should be paid to avoid the deterioration of electric characteristics such as transmission loss and isolation due to floating capacitance, etc. generated by interference between electrode patterns constituting each filter. However, to lay many constituents in the laminate substrate while avoiding interference between patterns, the laminate substrate inevitably has to have a large overall dimension, resulting in difficulty in further size reduction of the high-frequency circuit.

DISCLOSURE OF THE INVENTION

Accordingly, an object of the present invention is to provide a high-frequency circuit comprising an LC filter circuit comprising an inductance element and a capacitance element, and a filter circuit constituted by a SAW filter for branching high-frequency signals for pluralities of communications systems of different frequencies, thereby being able to handle pluralities of frequency bands (multi-bands) in a wireless communications apparatuses for pluralities of systems (multi-modes).

Another object of the present invention is to provide a small high-frequency device with excellent electric characteristics comprising such a high-frequency circuit.

DISCLOSURE OF THE INVENTION

The high-frequency circuit of the present invention for branching high-frequency signals for pluralities of communications systems of different frequencies comprises a lowpass filter circuit disposed between first and second ports, and/or a highpass filter circuit disposed between the first port and a fourth port; and a matching circuit and a bandpass filter circuit disposed between the first port and a third port; the lowpass filter circuit, the highpass filter circuit and the matching circuit comprising capacitance elements and inductance elements; the bandpass filter circuit being a SAW filter; and the passband f1 of the lowpass filter circuit, the passband f2 of the bandpass filter circuit, and the passband f3 of the highpass filter circuit meeting the condition of f1<f2<f3.

The matching circuit preferably comprises an inductance element connected between the first port and a ground, the inductance element having a Q value of 20 or more at 250 MHz to absorb electrostatic surge.

A diplexer circuit comprising a capacitance element and an inductance element is preferably connected to any one of the second to fourth ports. A switch circuit comprising a switching element is connected to any one of the second to fourth ports.

The SAW filter is preferably a balanced-unbalanced SAW filter comprising a balanced port and an unbalanced port. In this case, it is preferable that the unbalanced port is connected to the first port, while the balanced port is connected to the third port. A matching circuit comprising an inductance element and/or a capacitance element is preferably connected to the balanced port of the SAW filter. With the input impedance of the balanced port different from that of the unbalanced port, it can also function as an impedance-converting circuit.

The first port is preferably connected to a multi-band antenna.

The high-frequency device of the present invention comprises the above high-frequency circuit, at least part of circuit elements (inductance elements and capacitance elements) constituting the highpass filter circuit and/or the lowpass filter circuit, and the matching circuit being formed by electrode patterns in a laminate substrate, and the remaining circuit elements and the SAW filter being mounted onto the laminate substrate.

Electrode patterns forming the inductance element and capacitance element of the highpass filter circuit, electrode patterns forming the inductance element and capacitance element of the lowpass filter circuit, and electrode patterns forming the inductance element and capacitance element of the matching circuit are preferably disposed such that they do not overlap each other in a lamination direction of the laminate substrate.

In the high-frequency device of the present invention, the capacitance element and the inductance element constituting the matching circuit are preferably mounted onto the laminate substrate.

The inductance element for the matching circuit comprises a core having a leg at each end, a coil wound around the core, and a terminal electrode disposed on the lower side of the leg and connected to an end of the coil, the core being made of a non-magnetic, alumina-based ceramic material.

In the high-frequency device of the present invention, it is preferable that a ground electrode is formed substantially on an entire surface of a layer close to a mounting surface of the laminate substrate to prevent interference with a mounting substrate, and that LGA (land grid array) terminal electrodes are formed on the mounting surface of the laminate substrate, the terminal electrodes being connected to each filter through via-holes.

In the high-frequency device of the present invention, the passband f1 of the lowpass filter circuit, the passband f2 of the bandpass filter circuit, and the passband f3 of the highpass filter circuit preferably meet the condition of f1<f2<f3.

As described above, because the high-frequency circuit of the present invention comprises a filter circuit constituted by an inductance element and a capacitance element, and a filter circuit constituted by a SAW filter, it can handle pluralities of frequency bands (multi-bands) for pluralities of systems (multi-modes). With such high-frequency circuit formed in a laminate substrate, a small high-frequency device with excellent electric characteristics can be obtained.

DESCRIPTION OF THE PREFERRED EMBODIMENTS

Figure 1:
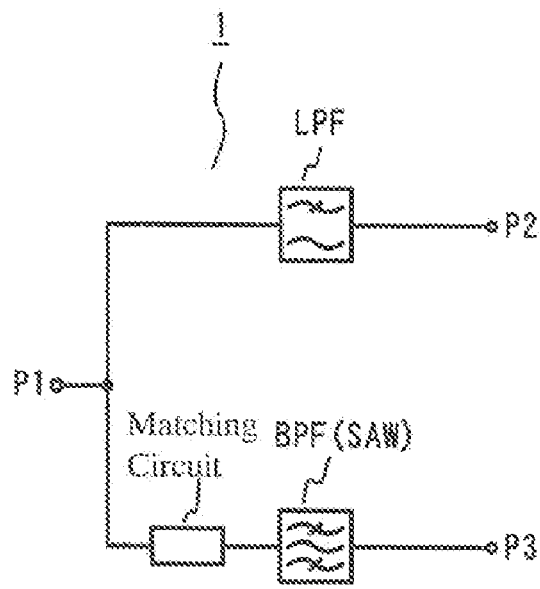
FIG. 1 is a block diagram showing a high-frequency circuit according to one embodiment of the present invention.
Figure 2:
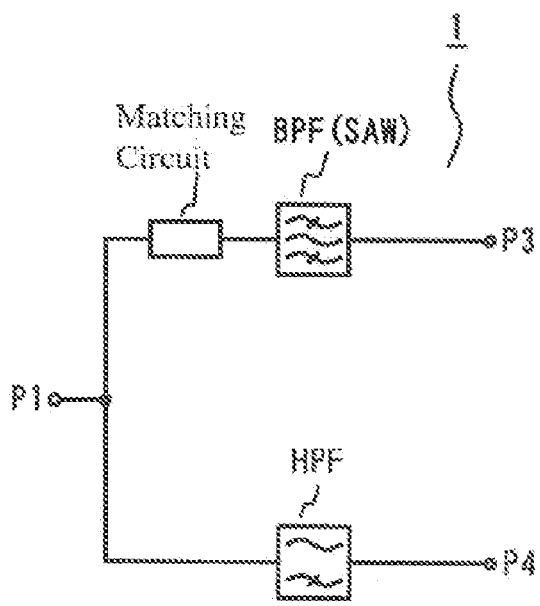
FIG. 2 is a block diagram showing a high-frequency circuit according to another embodiment of the present invention.
Figure 3:
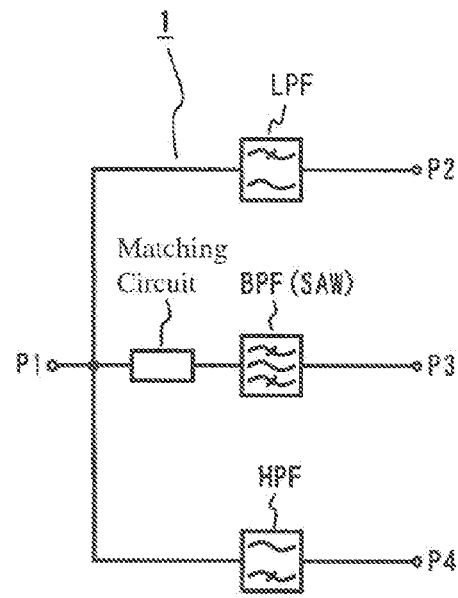
FIG. 3 is a block diagram showing a high-frequency circuit according to a further embodiment of the present invention.

FIGS. 1-3 show high-frequency circuits according to embodiments of the present invention. The high-frequency circuit 1 branches high-frequency signals for two or more communications systems of different frequencies. The high-frequency circuit 1 (diplexer circuit) has three types of structures; a structure in which a first port P1 is connected to second and third ports P2, P3 (FIG. 1), a structure in which a first port P1 is connected to third and fourth ports P3, P4 (FIG. 2), and a structure in which a first port P1 is connected to second and fourth ports P2, P4 (FIG. 3). These structures will be explained as a whole below. The high-frequency circuit 1 comprises a lowpass filter circuit LPF connected between a first port P1 and a second port P2, a matching circuit connected between the first port P1 and a third port P3, a bandpass filter circuit BPF connected to the matching circuit, and a highpass filter circuit HPF connected between the first port P1 and a fourth port P4, the bandpass filter BPF being constituted by a SAW filter.

Figure 4:
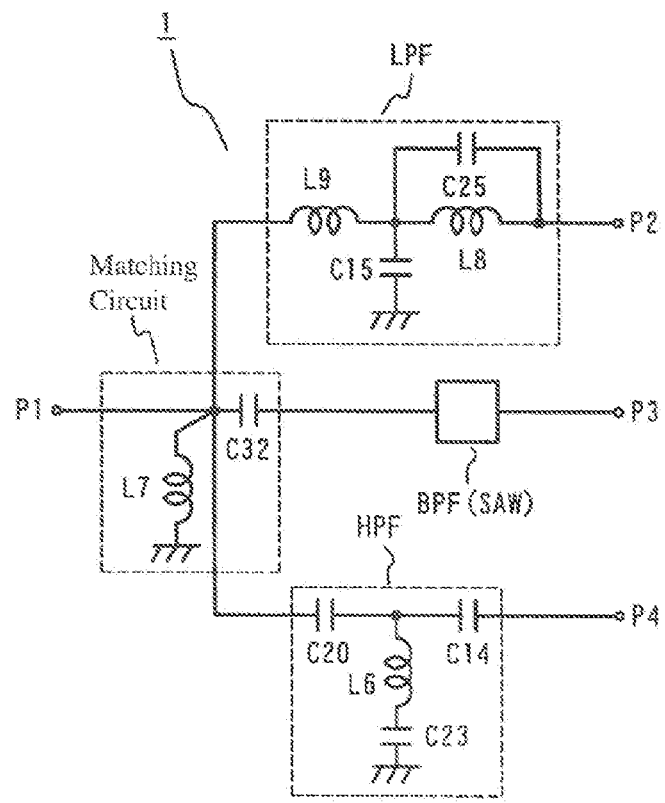
FIG. 4 is a view showing an equivalent circuit of the high-frequency circuit of FIG. 3.

FIG. 4 shows one example of equivalent circuits for the high-frequency circuit of FIG. 3. The lowpass filter circuit LPF is constituted by inductance elements L8, L9 and capacitance elements C15, C25, with a passband including the frequency band of the first communications system. The resonance frequency of a parallel resonance circuit comprising an inductance element L8 and a capacitance element C25 is within the frequency band of the second communications system, such that it has high impedance in the frequency band of the second communications system.

The highpass filter circuit HPF is constituted by an inductance element L6 and capacitance elements C14, C20, C23, with a passband including the frequency band of the third communications system. The resonance frequency of a series resonance circuit comprising the inductance element L6 and the capacitance element C23 is within the frequency band of the second communications system, such that it has high impedance in the frequency band of the second communications system.

The bandpass filter circuit BPF is constituted by a SAW filter, and a matching circuit is connected between the SAW filter and the first port P1. The matching circuit is constituted by a capacitance element C32 and an inductance element L7, not only functioning to match the input impedance of the SAW filter when viewed from the antenna to a predetermined impedance (for instance, about 50 Ω), but also functioning as a phase shifter. The phase shifter has a function to adjust a phase, such that the SAW filter has high impedance when viewed from the first port P1. Accordingly, high impedance can be achieved in the frequency bands of the first and third communications systems while obtaining predetermined impedance at a passband frequency.

The SAW filter is a device having breakdown voltage of at most about 50 V, vulnerable to electrostatic surge. It may also be constituted by an FET (field effect transistor) switch of GaAs (gallium arsenide), GaN (gallium nitride), etc. having low breakdown voltage. Thus, a grounded inductance element L7 as a lumped constant element is used for the matching circuit to absorb electrostatic surge, so that the SAW filter and the FET switch are not broken even when electrostatic surge is supplied from a human body to the antenna.

Figure 5:
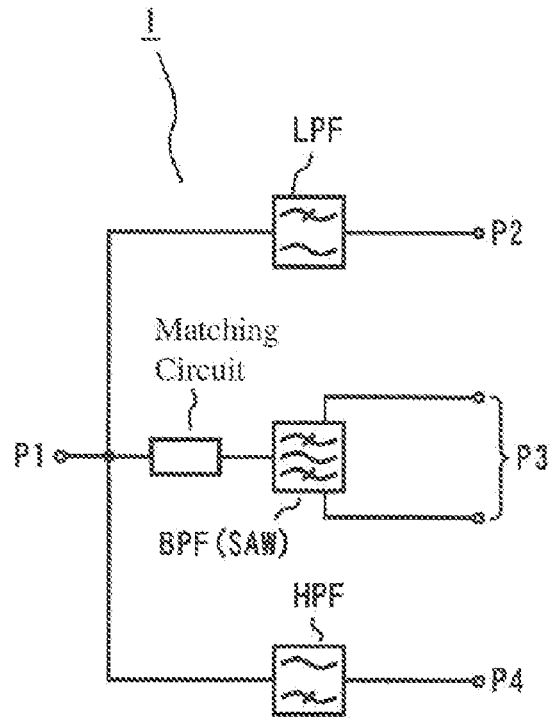
FIG. 5 is a block diagram showing a high-frequency circuit according to a still further embodiment of the present invention.

In the high-frequency circuit portion, part of the circuit is preferably balanced to improve noise characteristics to crosstalk, etc. For instance, a balanced-input, low-noise amplifier LNA may be used in a receiving circuit, to enhance receiving sensitivity by reducing a noise index. In such a case, as shown in FIG. 5, the use of a balanced SAW filter having a balanced port and an unbalanced port enables connection to a balanced high-frequency circuit without adding a balanced-unbalanced circuit. Because the low-noise amplifier LNA has various input impedance from about 50 Ω to about 300 Ω, the use of a balanced SAW filter whose unbalanced port and balanced port have different input impedance makes it easy to achieve connection to a high-frequency circuit having different input impedance.

Figure 6:
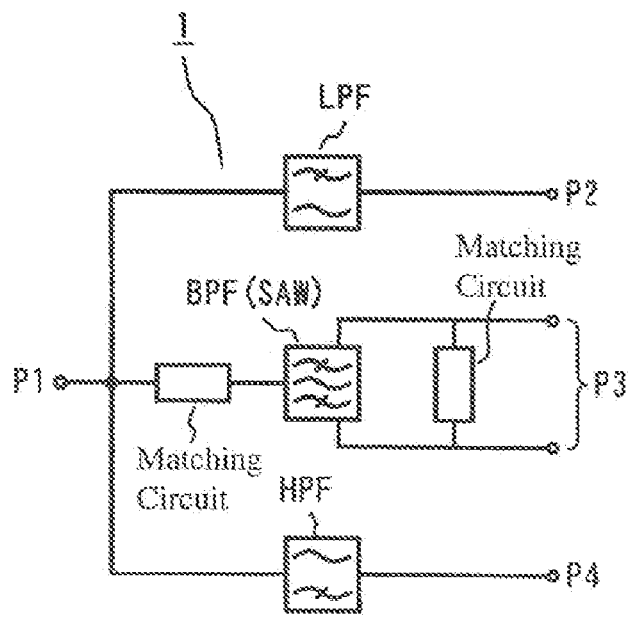
FIG. 6 is a block diagram showing a high-frequency circuit according to a still further embodiment of the present invention.
Figure 7:
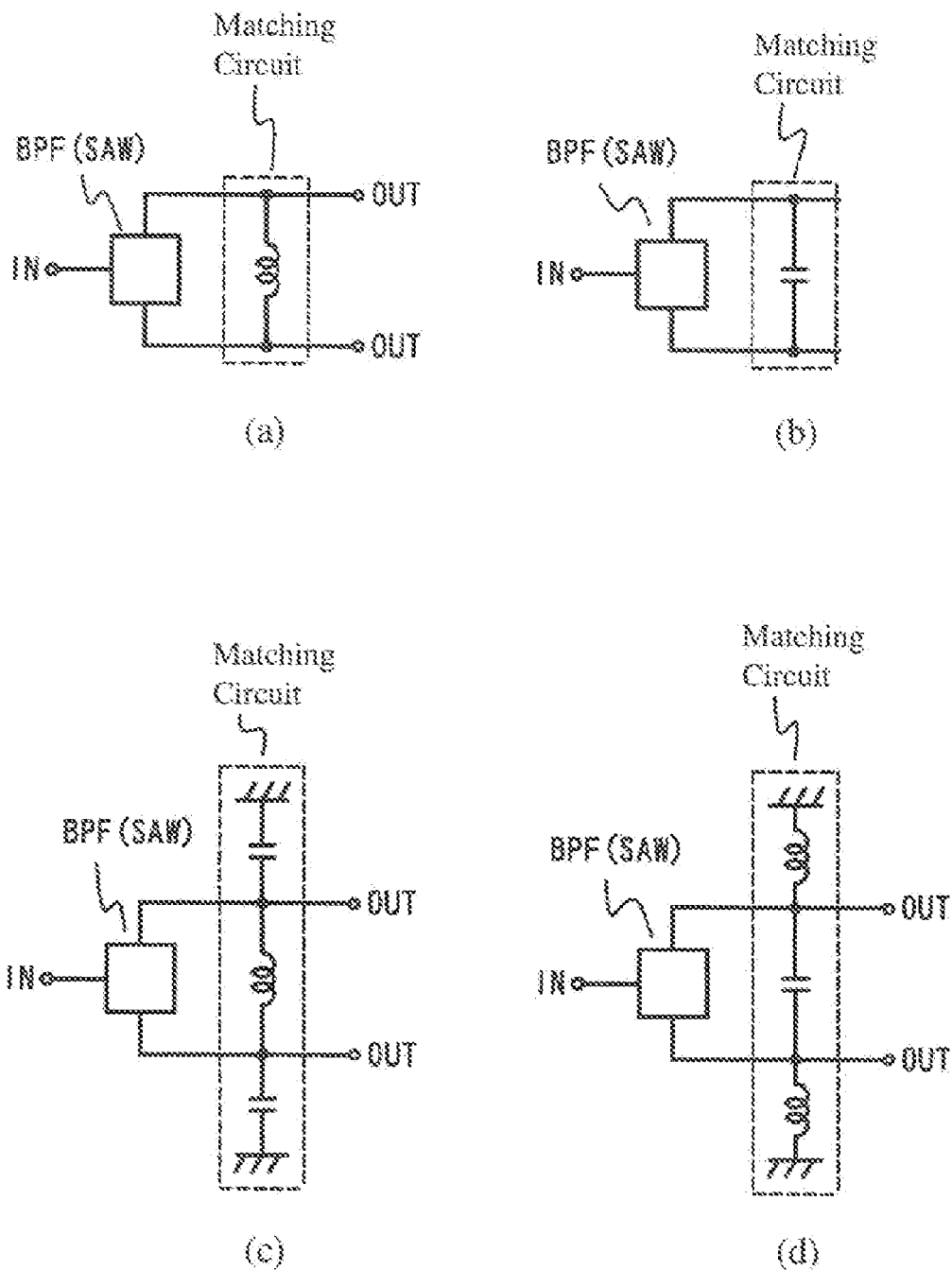
FIG. 7 is a view showing an equivalent circuit of a matching circuit connected to a balanced port of an unbalanced-balanced SAW filter.

When a small or inexpensive balanced SAW filter is used, it may have to have larger amplitude balance (signal amplitude difference between the balanced ports) and phase balance (signal phase difference) than the desired levels. The deterioration of the amplitude balance and the phase balance appears to occur for the reason that a signal input to the unbalanced port overlaps a signal output from the balanced port due to parasitic components such as parasitic capacitance, etc., so that a signal of the same phase is output from the balanced port. Accordingly, as in the circuit shown in FIG. 6, the matching circuit is preferably connected to the balanced port to reduce signal components of the same phase. The matching circuit comprises an inductance element and/or a capacitance element as shown in (a)-(d) in FIG. 7, for instance, to function as a phase circuit.

In the high-frequency circuit having the above structure, there is high impedance from the first port P1 to the third and fourth ports P3, P4 in the passband of the lowpass filter circuit LPF. Also, there is high impedance from the first port P1 to the second and fourth ports P2, P4 in the passband of the bandpass filter circuit (SAW filter). Further, there is high impedance from the first port P1 to the second and third ports P2, P3 in the passband of the highpass filter circuit HPF. As a result, a high-frequency signal for each communications system is prevented from leaking to the signal paths of the other communications systems, resulting in small transmission loss in each signal path. In addition, the use of the bandpass filter circuit constituted by a SAW filter can drastically reduce the number of circuit elements, resulting in a smaller diplexer circuit than conventional ones constituted only by LC filters.

For instance, in a case where the first communications system is DAMPS, the second communications system is GPS, and the third communications system is PCS, a receiving signal of GPS passes through a path between the first port P1 and the third port P3, DAMPS through a path between the first port P1 and the second port P2, and PCS through a path between the first port P1 and the fourth port P4.

Although the above description is directed to a case where different communications systems are handled by a path between the first and second ports, by a path between the first and third ports, and by a path between the first and fourth ports, the high-frequency circuit of the present invention can of course be used to branch transmitting and receiving signals in a certain communications system. For instance, in a case where the first communications system is DCS, and the second communications system is WCDMA, with a lowpass filter circuit between the first and second ports, and a bandpass filter circuit (SAW filter) between the first and third ports, the transmitting/receiving signals of WCDMA can be branched to different paths by passing the transmitting/receiving signals of DCS and the transmitting signal of WCDMA between the first and second ports, and passing the receiving signal of WCDMA between the first and third ports. In this case, another diplexer is not needed. To obtain a lowpass filter circuit permitting the transmitting/receiving signals of DCS and transmitting signal of WCDMA to pass, while drastically attenuating the receiving signal of WCDMA, pluralities of lowpass filters are preferably connected in tandem.

As shown in Table 1, in addition to WCDMA/DCS, there are communications systems using overlapping frequency bands or different but close frequency bands, for instance, GSM (transmitting frequency: 880-915 MHz, receiving frequency: 925-960 MHz) and DAMPS (transmitting frequency: 824-849 MHz, receiving frequency: 869-894 MHz), DCS (transmitting frequency TX: 1710-1785 MHz, receiving frequency RX: 1805-1880 MHz) and PCS (transmitting frequency TX: 1850-1910 MHz, receiving frequency RX: 1930-1990 MHz) and WCDMA (transmitting frequency TX: 1920-1980 MHz, receiving frequency RX: 2110-2170 MHz), etc. As long as communications systems use close or overlapping frequency bands, signals can pass through the same path in the high-frequency circuit of the present invention.

The embodiments of the present invention will be explained in detail referring to the drawings without intension of restricting the present invention.

First Embodiment

Figure 8:
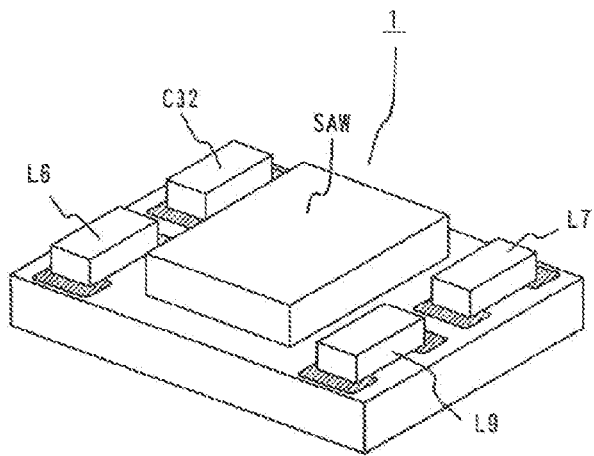
FIG. 8 is a perspective view showing a high-frequency device according to one embodiment of the present invention.
Figure 9:
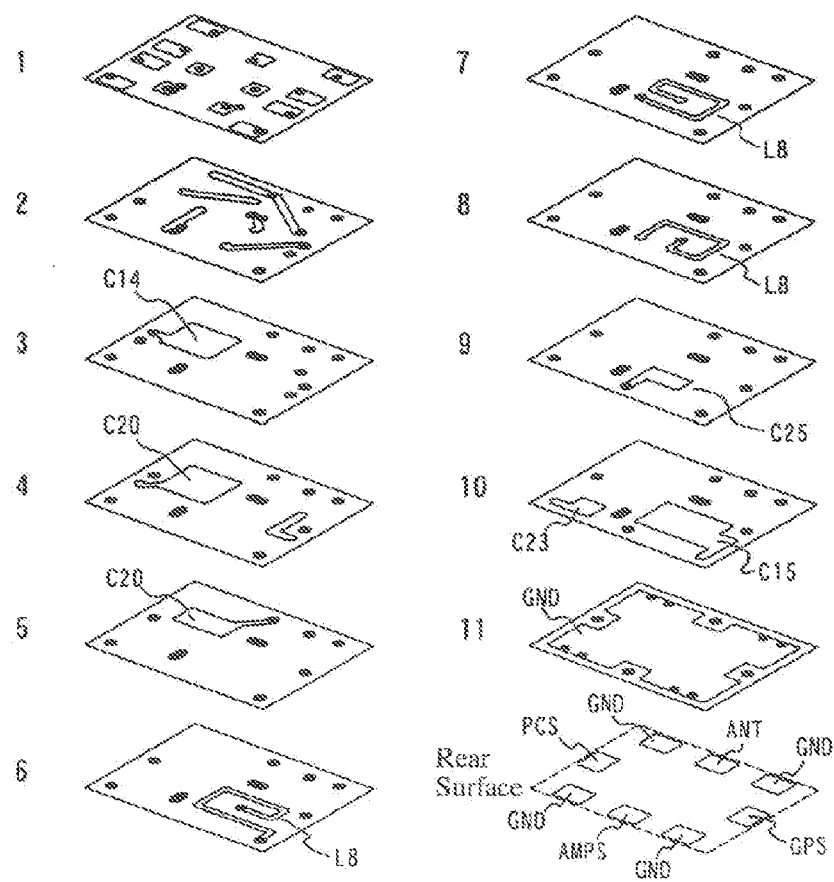
FIG. 9 is an exploded perspective view showing laminated layers constituting the high-frequency device according to one embodiment of the present invention.

FIG. 8 shows a high-frequency device comprising the high-frequency circuit of FIG. 2 formed in a laminate substrate, and FIG. 9 shows the structures of the laminated layers. Symbols in FIG. 9 correspond to those in FIG. 2. Circuit elements not shown in FIG. 9 are mounted onto the laminate substrate as shown in FIG. 8.

A high-frequency device having the same equivalent circuit as that of the high-frequency circuit shown in FIG. 2 is a one-chip diplexer comprising part of inductance elements and capacitance elements constituting a lowpass filter circuit, a highpass filter circuit and a matching circuit, which are formed by electrode patterns formed on sheets in a laminate substrate, and the remaining part of the inductance elements and the capacitance elements and a SAW filter mounted onto the laminate substrate as chip parts. This high-frequency device is adapted to DAMPS as a first communications system, GPS as a second communications system, and PCS as a third communications system.

The laminate substrate containing inductance elements and capacitance elements can be produced by printing a conductive paste based on Ag or Cu in a desired electrode pattern on each green sheet made of low-temperature-sinterable, dielectric ceramics and having a thickness of 10-200 μm, integrally laminating the resultant green sheets with electrode patterns, and sintering the resultant laminate. Each sheet constituting the laminate substrate may be formed by insulating resins or resin/ceramic composites, in addition to the dielectric ceramics.

An inductance element L8 and capacitance elements C15, C25 for constituting the lowpass filter LPF are formed by coil-shaped line patterns and capacitor patterns, which are formed on the sixth to 10th layers in the laminate substrate, an inductance element L9 is mounted onto the laminate substrate as a chip part, and they are connected through appropriate means such as via-holes (shown by black circles in the figure), etc.

Capacitance elements C14, C20, C23 for constituting the highpass filter HPF are formed by capacitor patterns, which are formed on the third to fifth and 10th layers in the laminate substrate, an inductance element 6 is mounted onto the laminate substrate as a chip part, and they are connected through appropriate means such as via-holes (shown by black circles in the figure), etc.

The SAW filter, and an inductance element L7 and a capacitance element C32 for constituting the matching circuit are mounted onto the laminate substrate. Although an unbalanced-input, unbalanced-output SAW filter is used in this embodiment, it should be noted that an unbalanced-input, balanced-output SAW filter may of course be used.

A ground electrode GND is formed on an entire surface of the 11th layer to prevent interference with a mounting substrate. LGA (land grid array) terminal electrodes are formed on a rear surface of the laminate substrate, and connected to each filter through via-holes. An external terminal ANT corresponds to the first port P1 in the equivalent circuit, an external terminal AMPS corresponds to the second port P2 in the equivalent circuit, an external terminal GPS corresponds to the third port P3 in the equivalent circuit, and an external terminal PCS corresponds to the fourth port P4 in the equivalent circuit.

Electrode patterns for inductance elements and capacitance elements formed in the laminate substrate for constituting the lowpass filter circuit LPF are arranged on the right side in each sheet shown in FIG. 9, and electrode patterns for capacitance elements constituting the highpass filter circuit HPF are arranged on the left side in each sheet, so that they do not overlap each other in a sheet lamination direction. Because the electrode patterns are disposed without overlap in a lamination direction, it is possible to prevent electromagnetic coupling between electrode patterns for constituting the filter and the matching circuit having different passbands and increase in parasitic impedance, thereby resulting in no deterioration of electric characteristics.

Each surface-mounted inductor L6, L7, L9 for the filters and the matching circuit, which is, for instance, 1005-size, comprises a coil wound around a core, legs projecting from the core at both ends, and terminal electrodes disposed on the lower sides of the legs and connected to coil ends. Because a magnetic field generated from the coil is substantially in parallel with the mounting surface, interference with the electrode patterns formed in the laminate substrate is suppressed. The inductors L6, L7, L9 have high self-resonance frequency and low loss. Accordingly, the high-frequency device exhibits excellent electric characteristics.

Materials for forming the core are preferably alumina-based, non-magnetic ceramics, for instance, non-magnetic ceramics comprising Al as a main component, and at least one selected from the group consisting o Mn, Cr, Ti, Si and Sr (Mn is indispensable) as a sub-component, and non-magnetic ceramics comprising Al as a main component, and at least one selected from the group consisting of Si, Ca, Ba, Ti, Ir and P (Si is indispensable) as a sub-component. It is particularly preferable that the self-resonance frequency of the surface-mounted inductor is sufficiently higher than the frequency band of each communications system, and that the non-magnetic ceramic has as high a Q value as 20 or more at 250 MHz.

Figure 10:
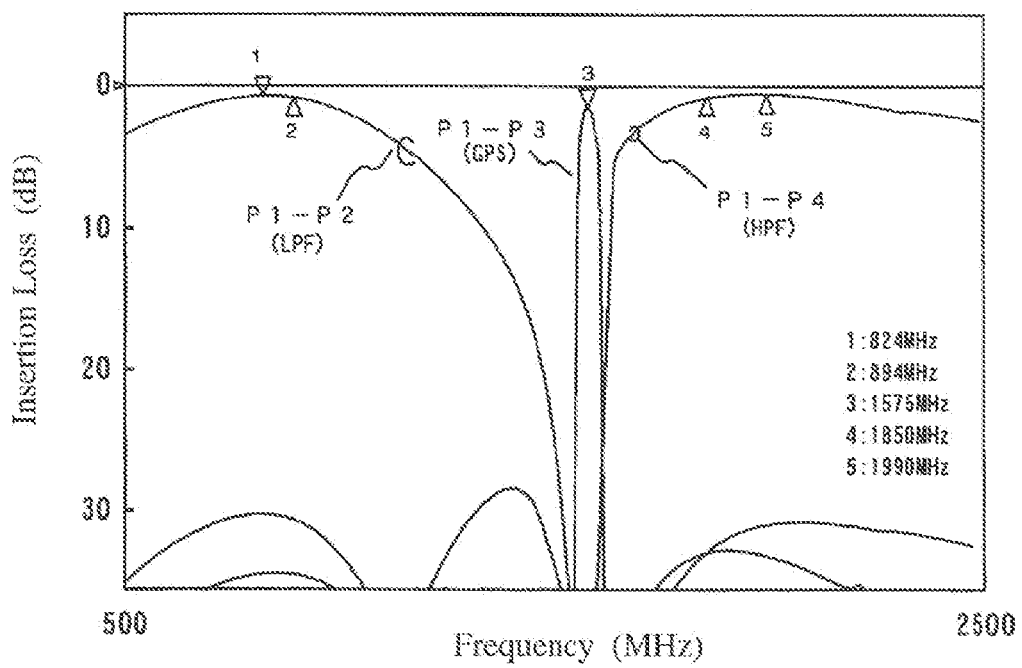
FIG. 10 is a graph showing the insertion loss characteristics of the high-frequency device according to one embodiment of the present invention.

As an example, inductance elements and capacitance elements for filter circuits were formed in a laminate substrate of 3.2 mm×2.5 mm×0.6 mm, and a 2015-size SAW filter, and 1005-size inductance element and capacitance element were mounted onto the laminate substrate. In this example, a high-frequency, coil-type inductor having a self-resonance frequency of 10 GHz and a Q value of 25 at 250 MHz was used as the inductance element. FIG. 10 shows insertion loss characteristics between the first and second ports (P1-P2), between the first and third ports (P1-P3), and between the first and fourth ports (P1 -P4). The lowpass filter circuit disposed between the first and second ports permits the transmitting/receiving signals of DAMPS to pass, but attenuates the transmitting/receiving signals of other systems. The SAW filter disposed between the first and third ports permits the receiving signal of GPS to pass, but attenuates the transmitting/receiving signals of other systems. The lowpass filter circuit disposed between the first and fourth ports permits the transmitting/receiving signals of PCS, but attenuates the transmitting/receiving signals of other systems. Each filter circuit has a small insertion loss in a frequency band of a signal that should pass and a sufficiently large insertion loss in a frequency band of a signal that should be attenuated. Thus, a small high-frequency device capable of branching high-frequency signals for three communications systems of DAMPS, GPS and PCS is obtained.

An electrostatic discharge (ESD) test was conducted according to IEC61000-4-2. It is required that the performance of a device is not deteriorated even by applying ±5 kV, and the high-frequency device of the present invention were neither destroyed nor deteriorated in electric characteristics even when ±7 kV was applied to its first port P1.

Second Embodiment

Figure 11:
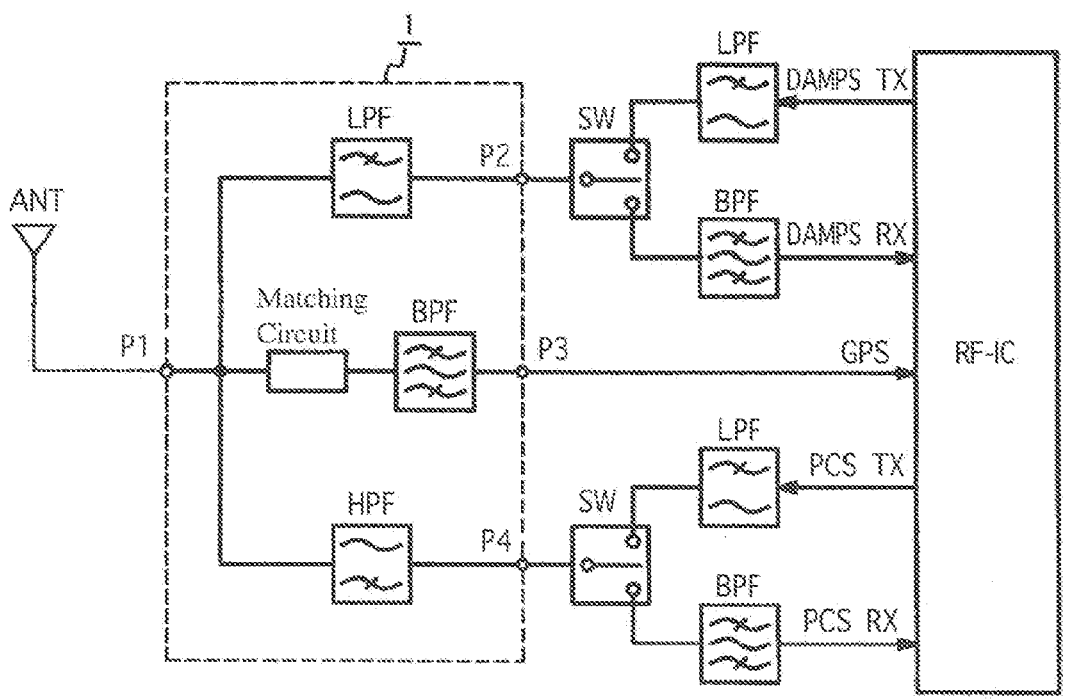
FIG. 11 is a block diagram showing a high-frequency circuit according to a still further embodiment of the present invention.

FIG. 11 shows a high-frequency circuit according to another embodiment of the present invention. This high-frequency circuit is suitably used for multi-band mobile phones comprising high-frequency devices as in the first embodiment. The high-frequency device 1 comprises a first port P1 connected to a multi-band antenna ANT, a second port P2 connected to a switch circuit SW for switching the paths of transmitting/receiving signals of DAMPS, and a fourth port P4 connected to a switch circuit SW for switching the paths of transmitting/receiving signals of PCS. A lowpass filter circuit LPF is disposed in each transmitting path for DAMPS and PCS, and a bandpass filter circuit BPF is disposed in each receiving path for DAMPS and PCS.

A third port P3, both lowpass filter circuits LPF and both bandpass filter circuits BPF of the high-frequency device 1 are connected to an amplifier circuit RFIC, which comprises a low-noise amplifier for amplifying and sending receiving signals from the multi-band antenna ANT to a signal-treating means (not shown) for conducting the modulation and demodulation of signals, a power amplifier for amplifying transmitting signals output from the signal-treating means and sending them to the multi-band antenna ANT, etc.

The switch circuit SW may be a high-frequency switch comprising a PIN diode or FET as a switching element. The lowpass filter circuit LPF may be an LC filter comprising an inductance element and a capacitance element. The bandpass filter circuit BPF may be an LC filter like the lowpass filter circuit LPF, but it is preferably a SAW filter comprising a piezoelectric resonator for the size reduction of a high-frequency circuit part.

Reactance elements for the switch circuit SW, the lowpass filter circuit LPF and the bandpass filter circuit BPF may be integrally formed by electrode patterns in the laminate substrate constituting the high-frequency device 1, or mounted onto the laminate substrate as chip parts together with switching elements and the SAW filter. The amplifier circuit RFIC, etc. may also be integrated, of course. With such structure, the high-frequency circuit part can be easily made as a small module.

In this embodiment, the signals of DAMPS pass through the first and second ports P1, P2, and the signals of PCS pass through the first and fourth ports P1, P4, while the receiving signal of GPS passes through the first and third ports P1, P3, thereby providing a small, multi-band, mobile phone having excellent ESD resistance.

Third Embodiment

Figure 12:
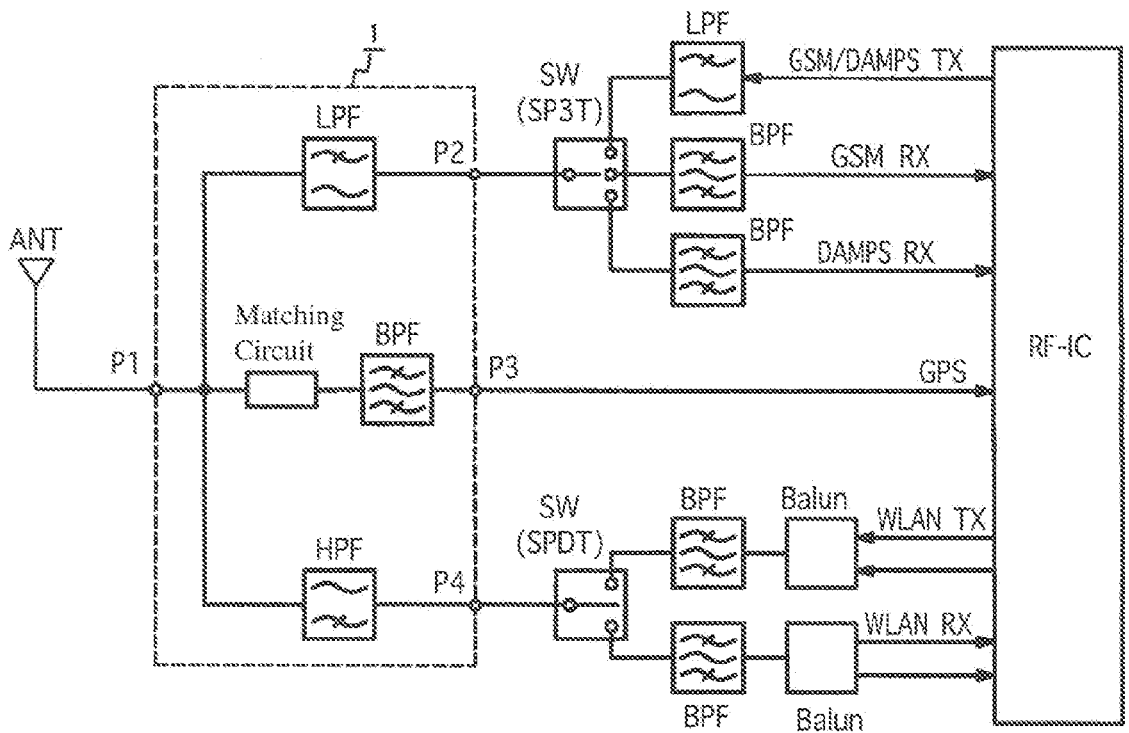
FIG. 12 is a block diagram showing a high-frequency circuit according to a still further embodiment of the present invention.

FIG. 12 shows a high-frequency circuit according to a further embodiment of the present invention. This high-frequency circuit is suitable for multi-band mobile phones comprising high-frequency devices as in the first embodiment. The high-frequency circuit of the third embodiment differs from that of the second embodiment, in that a single-pole, triple-throw (SP3T) switch circuit SW for switching paths for the transmitting/receiving signals of GSM and DAMPS is connected to a second port P2, that a single-pole, double-throw (SPDT) switch circuit SW for switching paths for the transmitting/receiving signals of WLAN is connected to a fourth port P4, that a lowpass filter circuit LPF or a bandpass filter circuit BPF is connected to the transmitting paths of DAMPS/GSM and WLAN, that bandpass filter circuits BPF are connected to the receiving paths of DAMPS/GSM and WLAN, and that circuits for performing convert between balanced and unbalanced signals Balun are connected between the bandpass filter circuits BPF disposed in the signal paths of WLAN and RFIC. The Balun constituted by inductance elements and capacitance elements would not be necessary, if the bandpass filter circuit BPF comprised a balanced port. The SP3T switch circuit SW switches the second port P2, the transmitting paths common to DAMPS and GSM, the receiving path for DAMPS, and the receiving path for GSM.

The high-frequency circuit in this embodiment can use the communications systems of DAMPS/GSM/GPS/WLAN. Namely, the signals of DAMPS/GSM pass through a path having the first and second ports P1, P2, and the transmitting/receiving data signals of WLAN pass through a path having the first and fourth ports P1, P4, while the receiving signal of GPS passes through a path having the first and third ports P1, P3. The high-frequency circuit in this embodiment can be constituted as a small module like in the second embodiment.

Fourth Embodiment

Figure 13:
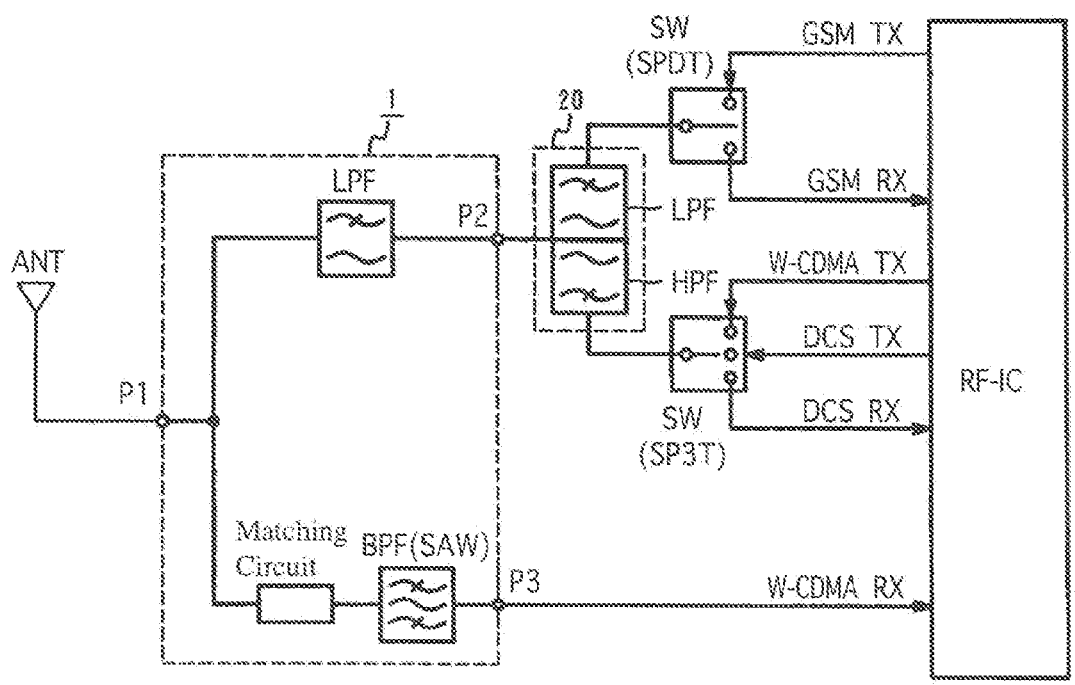
FIG. 13 is a block diagram showing a high-frequency circuit according to a still further embodiment of the present invention.

FIG. 13 shows a high-frequency circuit according to a still further embodiment of the present invention. This high-frequency circuit is suitable for multi-band mobile phones comprising high-frequency devices as in the first embodiment. In the high-frequency circuit in this embodiment, the second port P2 is connected to a diplexer circuit 20 comprising a lowpass filter circuit LPF and a highpass filter circuit HPF for branching the transmitting/receiving signals of GSM/DCS/WCDMA, and the highpass filter circuit HPF of the diplexer circuit 20 is connected to a single-pole, triple-throw (SP3T) switch circuit SW for switching paths for the transmitting signal of WCDMA and the transmitting/receiving signals of DCS. The transmitting and receiving signals of WCDMA are branched by the high-frequency device 1. The high-frequency circuit of the present invention can use the communications systems of GSM/DCS/WCDMA, using the communications systems of GSM/DCS through a path having the first and second ports P1, P2, while receiving the receiving signal of WCDMA through a path having the first and third ports P1, P3.

Fifth Embodiment

Figure 14:
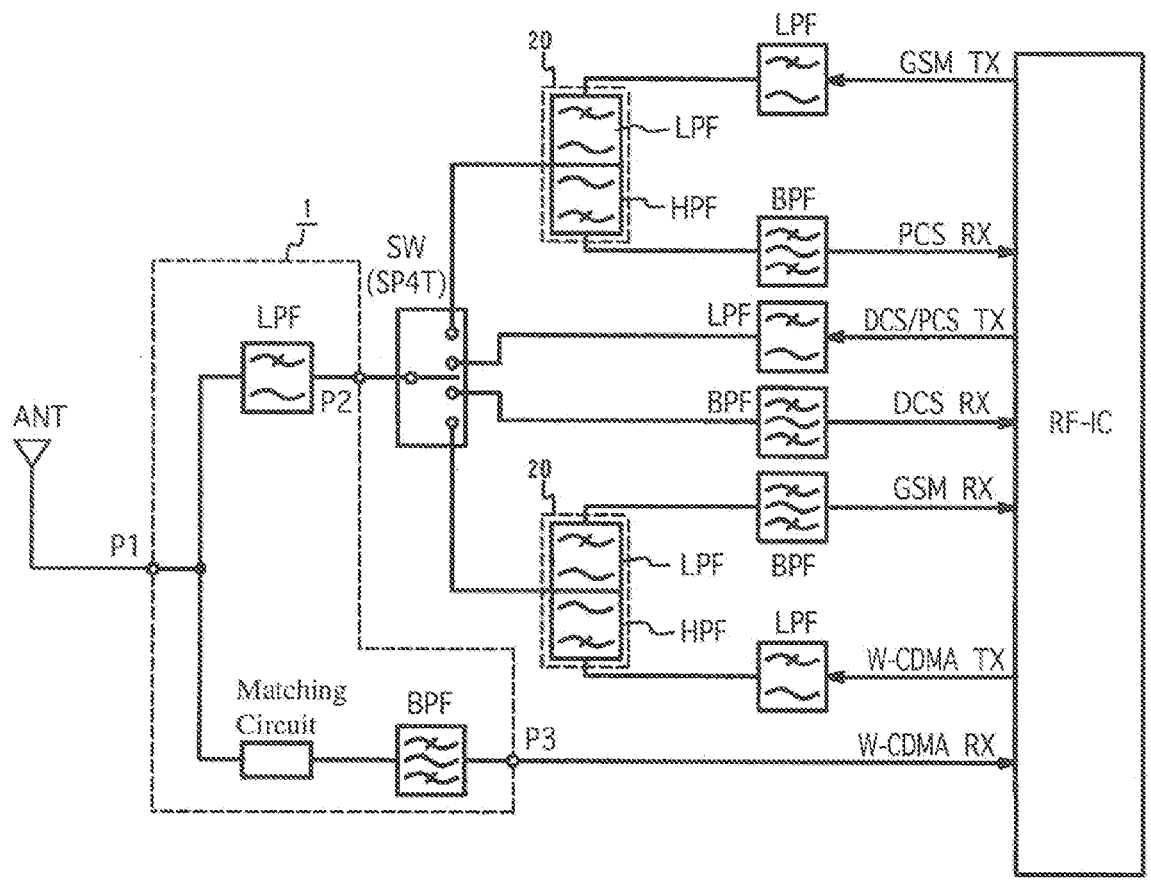
FIG. 14 is a block diagram showing a high-frequency circuit according to a still further embodiment of the present invention.
Figure 15:
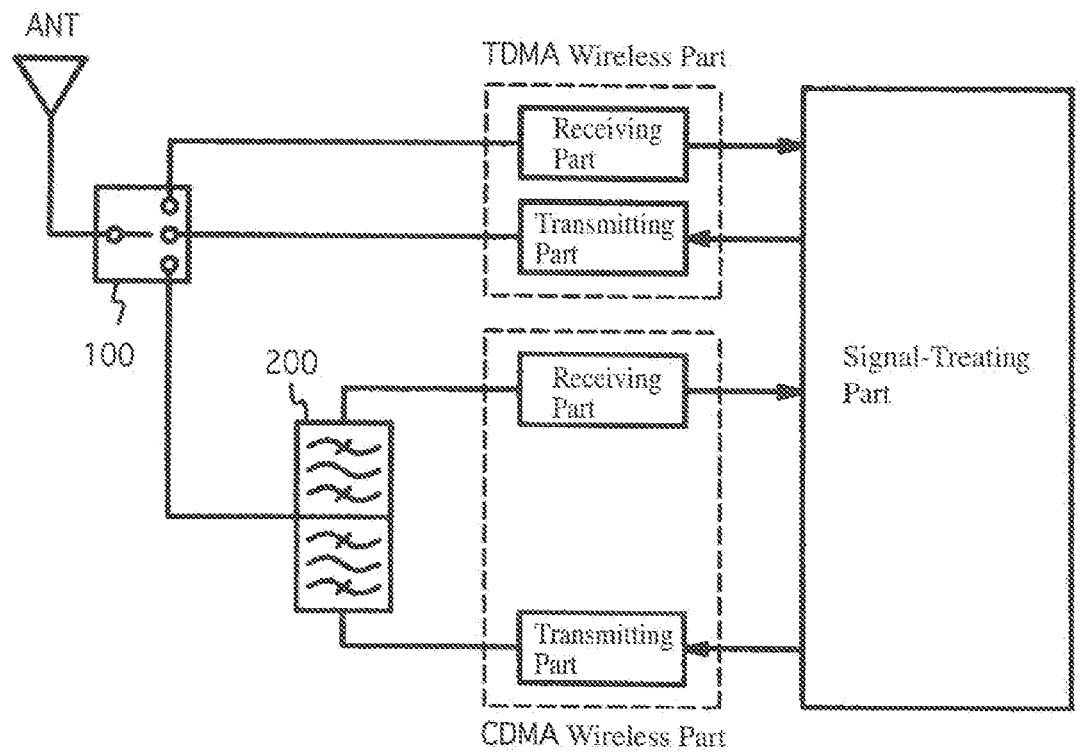
FIG. 15 is a block diagram showing a high-frequency circuit part in a conventional communications terminal.
Figure 16:
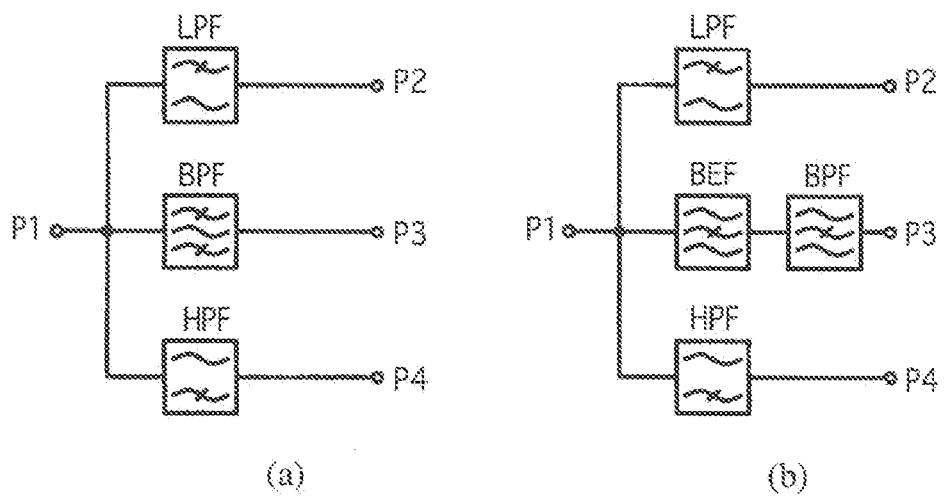
FIG. 16 is a block diagram showing a conventional diplexer circuit.

FIG. 14 shows a high-frequency circuit according to a still further embodiment of the present invention. This high-frequency circuit is suitable for multi-band mobile phones comprising high-frequency devices like the first embodiment. In the high-frequency circuit in this embodiment, a second port P2 is connected to a single-pole, quad-throw (SP4T) switch circuit SW for switching paths for the transmitting signal of WCDMA and the transmitting/receiving signals of GSM/DCS/PCS, and the SP4T switch circuit SW is connected to a diplexer circuit 20 for branching transmitting and receiving signals for different communications systems. Such structure provides, in addition to the above effects, such an effect that for instance, even when the harmonics of GSM leak to the signal path of PCS in the RFIC, they can be prevented from emanating from the multi-band antenna ANT.

The present invention is not restricted to the above embodiments, but may be properly modified within its concept.

INDUSTRIAL AVAILABILITY

As described above, because the high-frequency circuit of the present invention comprises a SAW filter and an LC filter circuit, the number of elements is so reduced that it can be made smaller with small insertion loss, resulting in the size reduction of front end portions of multi-band mobile phones. Accordingly, the high-frequency circuit of the present invention contributes to the size reduction and power save of multi-band mobile phones.

What is claimed is:

1. A high-frequency circuit for branching high-frequency signals for pluralities of communications systems of different frequencies, which comprises:
   a lowpass filter circuit disposed between first and second ports and/or a highpass filter circuit disposed between said first port and a fourth port; and
   a matching circuit and a bandpass filter circuit disposed between said first port and a third port;
   said matching circuit having an inductance element disposed between said first port and ground, and a capacitance element disposed between said first port and said bandpass filter circuit;
   said bandpass filter circuit being a SAW filter;
   the passband f1 of said lowpass filter circuit, the passband f2 of said bandpass filter circuit, and the passband f3 of said highpass filter circuit meeting the condition of f1<f2<f3;
   said lowpass filter circuit having a parallel resonance circuit comprising an inductance element and a capacitance element, said parallel resonance circuit having a resonance frequency within the passband f2 of said bandpass filter circuit;
   said highpass filter circuit having a series resonance circuit comprising an inductance element and a capacitance element, said series resonance circuit having a resonance frequency within the passband f2 of said bandpass filter circuit.

2. The high-frequency circuit according to claim 1, wherein said inductance element disposed between said first port and ground has a Q value of 20 or more at 250 MHz to absorb electrostatic surge.

3. The high-frequency circuit according to claim 1, wherein said inductance element of said series resonance circuit has a Q value of 20 or more at 250 MHz.

4. The high-frequency circuit according to claim 1, wherein said second to fourth ports are connected to an amplifier circuit,
   wherein a switch circuit comprising a switching element is disposed between said fourth port and said amplifier circuit, and
   wherein a bandpass filter circuit and a balanced-unbalanced circuit are disposed between said switch circuit and said amplifier circuit.

5. The high-frequency circuit according to claim 1, wherein said SAW filter comprises a balanced port connected to said third port, and an unbalanced port connected to said first port.

6. The high-frequency circuit according to claim 5, wherein a matching circuit comprising an inductance element and/or a capacitance element is connected to the balanced port of said SAW filter.

7. The high-frequency circuit according to claim 1, wherein said first port is connected to a multi-band antenna.

8. A high-frequency device comprising
   a lowpass filter circuit disposed between a first port and a second port and/or a highpass filter circuit disposed between said first port and a fourth port; and
   a matching circuit and a bandpass filter circuit disposed between said first port and a third port;

said matching circuit having an inductance element disposed between said first port and ground, and a capacitance element disposed between said first port and said bandpass filter circuit;

said bandpass filter circuit being a SAW filter;

the passband f1 of said lowpass filter circuit, the passband f2 of said bandpass filter circuit, and the passband f3 of said highpass filter circuit meeting the condition of f1<f2<f3;

said lowpass filter circuit having a parallel resonance circuit comprising an inductance element and a capacitance element, said parallel resonance circuit having a resonance frequency within the passband f2 of said bandpass filter circuit;

at least part of circuit elements (inductance elements and capacitance elements) constituting said highpass filter circuit, said lowpass filter circuit and said matching circuit being formed by electrode patterns and contained in a laminate substrate, and the remaining circuit elements and a SAW filter being mounted onto said laminate substrate.

9. The high-frequency device according to claim 8, wherein electrode patterns constituting the inductance element and the capacitance element of said highpass filter circuit, electrode patterns constituting the inductance element and the capacitance element of said lowpass filter circuit, and electrode patterns constituting the inductance element and the capacitance element of said matching circuit are disposed, such that they do not overlap each other in a lamination direction of said laminate substrate.

10. The high-frequency device according to claim 8, wherein the capacitance element and the inductance element constituting said matching circuit are mounted onto said laminate substrate.

11. The high-frequency device according to claim 10, wherein said inductance element for said matching circuit comprises a core having a leg at each end, a coil wound around said core, and a terminal electrode disposed on the lower side of said leg and connected to an end of said coil, said core being made of a non-magnetic, alumina-based ceramic material.

12. The high-frequency device according to claim 8, wherein a ground electrode is formed substantially on an entire surface of a layer close to a mounting surface of said laminate substrate to prevent interference with a mounting substrate, and LGA (land grid array) terminal electrodes are formed on the mounting surface of said laminate substrate, said terminal electrodes being connected to each filter through via-holes.

* * * * *